United States Patent [19]

Brahme et al.

[11] Patent Number: 5,175,495

[45] Date of Patent: Dec. 29, 1992

[54] DETECTION OF SEMICONDUCTOR FAILURES BY PHOTOEMISSION AND ELECTRON BEAM TESTING

[75] Inventors: Upendra Brahme; Sudhakar R. Gouravaram, both of Fremont; Ramin Halaviati, Capitola, all of Calif.

[73] Assignee: LSI Logic Corporation, Milpitas, Calif.

[21] Appl. No.: 720,710

[22] Filed: Jun. 25, 1991

Related U.S. Application Data

[63] Continuation-in-part of Ser. No. 694,291, Apr. 30, 1991.

[51] Int. Cl.[5] ............................................. G01R 31/28
[52] U.S. Cl. ................................. 324/158 R; 250/311; 371/27
[58] Field of Search ............... 324/158 R, 73.1, 96, 324/537, 501; 250/310, 311; 371/28, 27; 364/579

[56] References Cited

U.S. PATENT DOCUMENTS

| | | | |
|---|---|---|---|
| 4,169,244 | 9/1979 | Plows | 324/73.1 |
| 4,335,457 | 6/1982 | Early | 371/28 |
| 4,761,607 | 8/1988 | Shiragasawa et al. | 324/158 R |
| 4,812,748 | 3/1989 | Brust et al. | 250/311 |
| 4,875,002 | 10/1989 | Sakamoto et al. | 324/158 R |

OTHER PUBLICATIONS

Failure Mechanisms in Semiconductor Devices, E. A. Amerasekera, pp. 35-45.
Failure Analysis Using Focused Ion Beams, Test & Measurement World, Nov. 1980, pp. 97-101.
Ultraprobe Brochure, Ultraprobe, Laguna Hills, Calif.

*Primary Examiner*—Ernest F. Karlsen
*Attorney, Agent, or Firm*—Michael D. Rostoker; Gerald E. Linden

[57] ABSTRACT

A technique for pinpointing and analyzing failures in complex integrated circuits is disclosed. A device-under-test (DUT) is powered up. Using Liquid Crystal (LC) or Photo-Emission (PE) techniques, leakage sites are identified. The leakage sites are associated with suspect circuit elements on the DUT, and candidate I/Os associated with the suspect failing elements are selected for subsequent testing. Using the candidate I/Os, a truncated set of test vectors is created, and applied to the DUT. While the DUT is running the truncated set of test vectors, the suspect elements are rigorously probed to identify failing elements. SEM images are preferably viewed simultaneously. In this manner, a log of failing elements is derived, for circuit or process re-design.

8 Claims, 1 Drawing Sheet

DETECTION OF SEMICONDUCTOR FAILURES BY PHOTOEMISSION AND ELECTRON BEAM TESTING

CROSS-REFERENCE TO RELATED APPLICATIONS

This is a continuation-in-part of commonly-owned, copending U.S. patent application Ser. No. 694,291, entitled METHOD AND APPARATUS FOR INTEGRATED CIRCUIT DIAGNOSIS and filed on Apr. 30, 1991 by Halaviati, Shastry and Jefferson.

TECHNICAL FIELD OF THE INVENTION

The invention relates to the analysis and debugging of complex integrated circuit devices, particularly submicron Very Large Scale Integrated (VLSI) circuits.

BACKGROUND OF THE INVENTION

Modern semiconductor devices can employ hundreds of thousands of gates, and more than a million individual transistors. Aside from the design challenges, discussed briefly below, physical devices must be rigorously tested to verify not only correct functionality but also failure-free fabrication. A common fabrication problem is metallization failure.

Metallization failures in integrated circuits are mostly caused by corrosion, mechanical stress and electromigration. These failures are described in *Failure Mechanisms in Semiconductor Devices*, Amerasekera and Campbell, John Wiley & Sons, 1987, pp. 35-45.

Various diagnostic "tools" have been used individually to locate, confirm and analyze failures in complex integrated circuits. These tools include:

a. Liquid Crystal techniques, wherein a liquid crystal material is "painted" onto a powered-up device, are useful in mapping the general location of a defect, which will exhibit itself (by color change) as "leakage site" on the device. However, these techniques are not useful in accurately pinpointing the defect site, due to poor resolution.

b. Micro-probing techniques, wherein a probe is physically placed on the device, such as at a particular metal trace, is useful in pinpointing a failure, which will exhibit itself as a voltage on the probe. However, such physical probing techniques tend to be destructive, and are limited to technologies greater than one micron. They simply are not feasible for devices employing submicron technologies.

c. Photo-emission microscopy can detect power dissipation in transistors, and is based on the principle of detecting photons generated during electron-hole pair recombination, and has been used to detect leakages typically in the nano-Amp (nA) to milliAmp (mA) range, such as from gate-oxide leakage, junction spiking and latch-up phenomena, electrostatic discharge (ESD) induced failures, avalanche breakdown, and transistors operating in saturation. It is however ineffective in detecting resistive shorts, since very little, if any, electron-hole pair recombination occurs at these sites. Thus, failures such as heavily damaged dielectrics and junctions would not be able to be detected. Furthermore, photo-emission testing is sensitive to the transistor type, and has a greater chance of detecting n-channel than p-channel MOS (Metal Oxide Semiconductor) defects.

d. E-Beam (Electron Beam) voltage contrast microscopy is based on the principle that a focussed beam of electrons can be used to measure the voltage waveform on the metallization of a VLSI circuit, and has been used to detect failing circuit functionality, namely open metal, open contact and open via. The focussed primary electron beam is directed onto the region of interest, and low energy electrons are produced through secondary emission. A Scintillator/Photomultiplier is used to detect the voltage on the metallization of the VLSI chip. Defects are identifiable regardless of the magnitude of the leakage current. An example of an E-Beam Prober is the Schlumberger IDS 5000, discussed in greater detail below.

e. Focussed Ion Beam for "micro-surgery" of VLSI circuits involves milling through passivation (or other layers) to uncover a submerged trace or test point and cutting a trace to isolate circuitry, as described, e.g., in *Failure Analysis Using Focused Ion Beams*, Test & Measurement World, November 1990, pp. 97-102.

f. Ultraviolet Non-contact Voltage Probing utilizes a photoelectric effect for making voltage measurements on conductor lines. Both DC voltage and AC waveform measurements can be made to submicron dimensions, as described, e.g., in *Ultraprobe Brochure*, Ultraprobe, Laguna Hills, Calif.

Returning our attention to the design phase, modern ECAD (Electronic Computer-Aided Design) systems facilitate the design of electronic circuits by providing a user with a set of software tools running on a digital computer. These software tools generally include a schematic editor, a schematic compiler, and a simulator, and numerous examples are available to the test engineer.

The schematic editor tool is pivotal to the operation of an ECAD system. By using this tool, a circuit designer can create and edit complex circuits, using both previously-created (stored) circuit descriptions and specially-created circuit descriptions, and interconnecting same. The display is conveniently in the form of a schematic diagram. Usually, a netlist or other numerical representation of the circuit is derived, typically by a compiler tool in the ECAD system, and the circuit design can be simulated with a simulator tool, also resident in the ECAD system. When the designer is satisfied that the circuit design is valid, a layout tool is invoked to produce yet another numerical representation of the circuit for use by fabrication equipment to create a physical device. Commonly, the various representations of the circuit are available interactively to the designer, who can switch from a schematic view, to a netlist, to a layout view.

The simulation phase of design is especially important, for if the design does not work at this stage, it certainly will not perform on a physical device. In order to simulate a circuit, the designer prepares a comprehensive list of input stimuli representing real input values to be applied to the simulation model of the circuit. The digital representation of the circuit is then compiled by a schematic compiler and translated into a form which is best suited to simulation. This new, translated representation of the circuit is then acted upon by a simulator, which produces numerical output analogous to the response of a real circuit with the same inputs applied. This output is then usually presented to the user in a graphical fashion. By viewing the simulation results, the user may then determine if the represented circuit will perform correctly when it is constructed. If not, he may then re-edit the schematic of the circuit using the schematic editor, re-compile and re-simulate.

This process is performed iteratively until the user is satisfied that the design of the circuit is correct.

The Modular Design Environment ("MDE") produced by LSI Logic Corporation of Milpitas, Calif., is a suite of software tools for computers running the UNIX operating system produced by AT&T Corporation. For purposes of this discussion, MDE (resident in an appropriate workstation) shall be considered an ECAD system.

MDE comprises a schematic editor (LSED) and a simulator (LDS), among other software programs, and provides an example of commercially available tools of the aforementioned type. Another example of a schematic editor, schematic compiler, and schematic simulator may be found in the SCALDstation produced by Valid Logic Systems, Inc. of Mountain View, Calif.

After the design and simulation process is completed, to the designer's satisfaction, a physical device will be created. As noted above, this process is greatly facilitated a layout tool in the ECAD system. Masks are produced, based on the layout data, and the device is fabricated on photolithography equipment (e.g.).

After a physical device is created, it must be tested to verify its functionality. Various stand-alone testers are capable of applying a comprehensive set of test vectors (signals) to the inputs of the device, and logging (recording) signals at the outputs of the device. First, however, the test vectors must be generated, and these may be derived from the ECAD system's simulation stimuli. When, however, a fault is indicated, the tester can only provide "gross" information about the manifestation of the fault as indicated by a faulty voltage level on an output pin. In order to identify the source of the fault, it is necessary to trace the fault back from the output pin, generating a "fault tree" of candidate gates, nets, and the like, (i.e., "circuit elements") that are malfunctioning, and physically examine the condition of each of these candidate sources of error.

Examples of logic testers are found in the following patents and publications, incorporated by reference herein: U.S. Pat. Nos. 4,928,278, 4,726,025 and 4,705,970 and Application Note, "Automated Digital Signal Processing" (Massachusetts Computer corporation, 080-00976-00 0887-976).

In order to probe individual gates, or parts of gates, such as particular diffusion areas, vias, contacts, polysilicon structures, metallization layers, and the like, a probe tool having extremely fine resolution is required. Physical probing tools are somewhat effective, but tend to damage the device. Non-contacting probes, such as an electron beam (e-beam) prober, offer positional resolution on the order of 0.2 $\mu$m, and are non-destructive.

One example of an E-Beam prober is the IDS 5000 E-Beam Prober, available from Schlumberger Technologies. The IDS 5000 is able to measure the state at precise locations (e.g., individual nets) on a device-under test ("DUT"). In the IDS 5000, an electron optical system produces a focused electron beam small enough to probe the most advanced device geometries (e.g., down to 0.3 microns). The following "tools" are also included in the IDS 5000:

An interactive positioning tool is provided for positioning the e-beam probe.

A Scope Tool is provided for displaying "live" waveforms at selected positions on the device, as detected by the e-beam probe.

A "navigational" tool is provided, which can be loaded with schematic, netlist, and layout representations of the DUT, to facilitate backtracking from one level of representation to another, without manual signal tracing.

A Scanning Electron Microscope (SEM) Tool provides a voltage-contrast image of the DUT in real time, and shows the logic states of different nets.

A pointer in the SEM or layout displays can be moved interactively, and the signal detected by the probe at a corresponding point on the DUT is continuously displayed in the Scope Tool.

A Layout Tool allows the user to "browse" through the downloaded physical layout of the DUT and locate a particular signal without referring to hard-copy plots. The Layout Tool has a notion of hierarchy, and subcells can be exploded.

A Schematic Tool graphically displays the downloaded schematic of the DUT, which is transferred to the IDS from outside the system. With this tool, the user is able to "browse" through the design, and links to the Layout Tool allow selection of a net in the schematic and corresponding net in the Layout Tool. A netlist text file can also be downloaded and displayed, and used in a similar manner.

DUTs can be tested by connecting to a tester, and increasing clock speeds until a DUT starts to fail, and comparing signal measurements at the various clock speeds. A Dynamic Fault Imaging Application Tool can acquire a sequence of stroboscopic measurements from a known good device and compare these images with a similar sequence from a device-under-test (DUT).

Equipment such as the IDS 5000 has enormous capability to measure signal levels at precise locations on a DUT, thereby allowing for precise analysis of suspect failing circuit elements, and also has a reasonably friendly user interface to allow interactive positioning of the e-beam probe, once schematics and layouts (and netlists) are loaded. Nevertheless, an element-by-element analysis, employing a comprehensive set of test vectors is time consuming.

On the other hand, leakage detection techniques such as Liquid Crystal and Photo-Emission (described above) provide only the sites showing leakages of where a fault is occurring, but in this sense these techniques are faster.

ECAD systems have no inherent ability to test a physical device.

What is needed is a technique for quickly pinpointing faults in a device, and such is disclosed herein.

DISCLOSURE OF THE INVENTION

It is therefore an object of the present invention to provide an improved technique for analyzing integrated circuit devices (DUTs), such as gate-intensive ASICs (Application-Specific Integrated Circuits).

It is a further object to reduce the time taken to debug semiconductor failures.

According to the invention, a powered-up device (DUT) is subjected to low resolution testing techniques, such as Liquid Crystal (LC) or Photo-Emission (PE) techniques, and "leakage sites" are identified.

Once leakage sites ("nets") are detected, high resolution probing, such as E-beam probing, is used to "zoom" in to these nets and detect failures very quickly.

The leakage sites ("nets") are associated with suspect failing circuit elements on the DUT, and candidate I/Os associated with the suspect failing circuit elements are selected for subsequent testing with the E-beam prober.

Using the candidate I/Os, a set of test vectors is created and applied to the DUT. This truncated set of test vectors is preferably derived from a simulation database in an ECAD system.

While the DUT is running the truncated set of test vectors, the suspect failing circuit elements are rigorously probed to identify failing elements. Live waveforms generated by the prober can be viewed along with simulated waveforms generated by the ECAD system. SEM images are preferably viewed simultaneously. In this manner, a log of failing elements is derived, for circuit or process re-design.

Other objects, features and advantages of the invention will become apparent in light of the following description thereof.

DETAILED DESCRIPTION OF THE INVENTION

Figure 1:
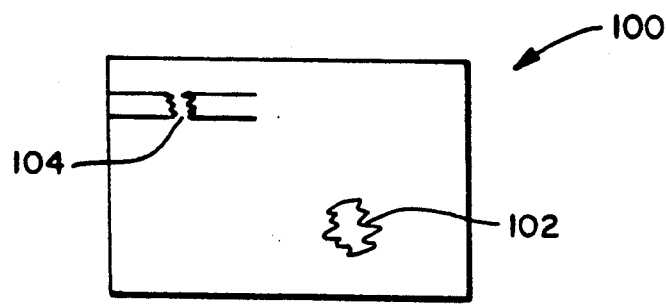
FIG. 1 is plan view of a device under test (DUT), according to the present invention.

FIG. 1 shows a device-under-test (DUT) 100. Using a gross testing technique, such as Liquid Crystal or photo-emission (both of which are described above), the device 100 is powered-up. A "leakage site" is shown (greatly exaggerated) at 102, and indicates a fault somewhere on the device 100. Depending on the type of failure causing the leakage site 102, the failing element may or may not be located at the same position on the DUT as the leakage site. In this case, the failing element is an input line 104 exhibiting open metallization (shown greatly exaggerated), and is located remote from the leakage site 102. Generally, the failure will be coincident with the leakage site if the failure is attributable to resistive gate leakage, contact failure, spiking or junction leakage, and will not be coincident with the leakage site if attributable to metallization failure (as illustrated in FIG. 1) or via failure. These failure types have been described above.

As shown in FIG. 1, the failure 104 is not coincident with the leakage site. However, it is certainly associated therewith, and the present invention capitalizes on this association. As described hereinbelow, this information will be used to test various suspect failing circuit elements associated with the leakage site, until the failing element is identified.

Backtracking for a moment, consider the case of simply applying a comprehensive set or test vectors via a tester (e.g., logic analyzer) to the DUT. Such a test would reveal a faulty I/O, but would not provide much direct information about the source of the failure within the DUT.

Figure 2:
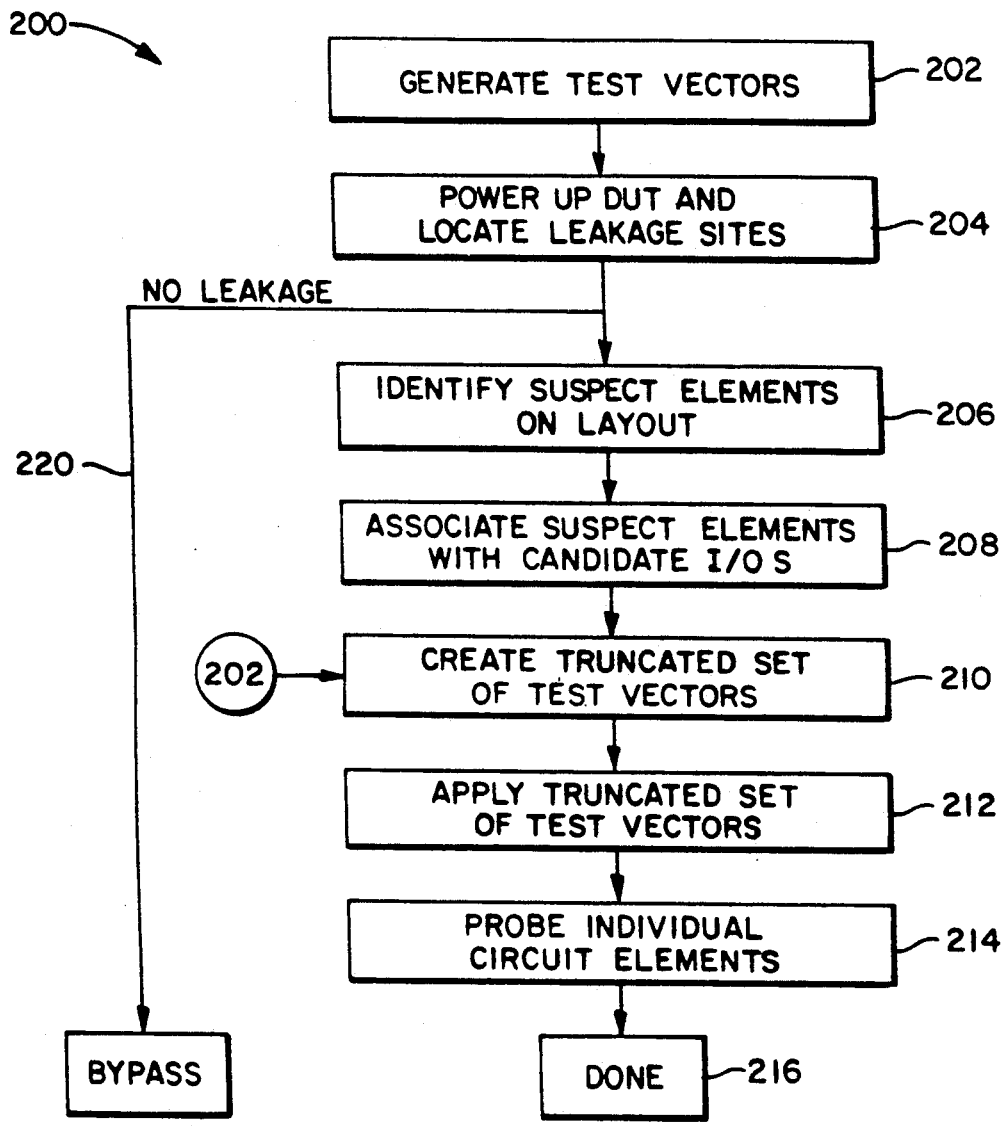
FIG. 2 is a block diagram of the testing technique of the present invention.

FIG. 2 illustrates the testing technique 200 of the present invention. In what is preferably a first step 202, a comprehensive set of test vectors are generated. These are conveniently derived from a comprehensive file of simulation input stimuli, available in the ECAD system (described above).

In the prior art, the comprehensive set of test vectors would be used at this point by a tester, logic analyzer or the like (not shown) to exercise the inputs of a device-under-test (DUT), and the response of the DUT outputs will be logged.

In the present invention, in a step 204, the DUT is simply powered up, and a "gross" diagnostic technique such as Liquid Crystal (LC) or Photo-Emission (PE) is used to identify leakage sites in the powered-up device. FIG. 1 shows such a leakage site 102.

Next, in a step 206, the leakage sites are associated with "suspect" failing circuit elements in the DUT. This is done by comparing the leakage sites with a presentation of the physical layout of the DUT. This presentation of the physical layout, and associated schematic, are readily available in the ECAD system (described above). Also, as mentioned above, they are also available, as downloaded, in the E-Beam Prober the use of which is discussed below).

In a next step 208, "candidate" failing I/Os are identified as those I/Os connected to the suspect failing circuit elements. In order to arrive at a list of candidate failing I/Os, the designer works back into the schematic of the device through the layout presentation (e.g., on the ECAD system).

In a next step 210, the candidate failing I/Os are used to create a truncated set of test vectors for exercising only those I/Os associated with the suspect failing circuit elements. Again, this step is conveniently performed in the familiar environment of the ECAD system, by examining the list of simulation input stimuli for stimuli exercising the candidate I/Os, and creating the truncated list of test vectors based on the result of that examination. All of this can be highly automated in the ECAD system.

In a next step 212, the truncated set of test vectors created in the step 210 are applied to the DUT, and the device is exercised to verify that there is indeed a failing I/O. The failure should appear instantly, but it may appear only as the clock speed is increased to a critical threshold.

The truncated set of test vectors are cycled repeatedly through the DUT, as required to force the failure under examination, and the suspect failing elements are probed, one-by-one, with a suitable prober such as an e-beam prober, in a step 214. An E-Beam Prober such as the IDS 5000, discussed above, is suited to this application, and incorporates a scanning electron microscope (SEM) which allows the failing element to be viewed (once it is located). The SEM also facilitates positioning the probe, for analysis of suspect failing elements.

Advantageously, the prober has a high resolution viewing device, such as a scanning electron microscope (SEM) associated therewith, for viewing suspect failing elements as they are probed.

As one or more suspect elements are identified (and one is sufficient to render a device inoperative), for one reason or another, in a final step 216 labelled "DONE", the suspect element is logged as having failed. Preferably, the remaining suspect elements are probed, since the failure mode may be somewhat endemic to a particular fabrication process step or to a particular physical location on the DUT.

If it is determined in the step 204 that there are no leakage sites on the DUT, the DUT can simply be tested with the comprehensive set of test vectors, as indicated by the path labeled 220, leading to "BY-PASS").

As the device is exercised by the tester and probed by the e-beam prober, live waveforms will be generated for the suspect failing element being probed.

Advantageously, simulated waveforms generated by the ECAD system can be simultaneously viewed, and compared with the live waveforms to provide further information about the performance of the suspect failing element, and logic associated with it, as disclosed in the above-referenced commonly-owned, copending U.S. patent application Ser. No. 694,291, entitled METHOD AND APPARATUS FOR INTEGRATED CIRCUIT DIAGNOSIS and filed on Apr. 30, 1991 by Halaviati, Shastry and Jefferson.

What is claimed is:

1. A method of testing integrated circuit devices, comprising the sequential steps of:
   (a) powering-up an integrated circuit device;
   (b) identifying leakage sites on the powered-up device;
   (c) associating suspect failing circuit elements with the leakage sites identified in step (b);
   (d) generating a set of test vectors associated with only the suspect failing circuit elements; and
   (e) applying the set of test vectors to the device.

2. Method according to claim 1, further comprising:
   in the step (c), associating candidate I/Os to the suspect failing elements; and
   in the step (d), generating the set of test vectors base on the candidate I/Os.

3. Method according to claim 1, further comprising:
   independent of the steps (a) through (e), generating a comprehensive set of test vectors suitable for exercising all of the I/Os of the device on an ECAD system; and
   using the ECAD system to generate, based on the results of the steps (a) through (c), the set of test vectors applied in the step (d) as a truncated set of the comprehensive set of test vectors.

4. Method according to claim 1, further comprising:
   while applying the set of test vectors to the device (step (e)), measuring the response of individual suspect failing circuit elements with an e-beam prober.

5. Method according to claim 4, further comprising:
   while measuring the response of suspect failing circuit elements with an e-beam prober, viewing the suspect failed elements with a scanning electron microscope.

6. Method according to claim 4, further comprising:
   viewing the response of suspect failing circuit elements measured by the e-beam prober as live waveforms; and
   simultaneously viewing simulated waveforms for the suspect failing circuit elements.

7. Method according to claim 1, wherein:
   the leakage sites are identified using Liquid Crystal techniques.

8. Method according to claim 1, wherein:
   the leakage sites are identified using photo-emission techniques.

* * * * *